United States Patent [19]
Fettweis et al.

[11] 3,980,872
[45] Sept. 14, 1976

[54] DIGITAL FILTER FOR ELECTRICAL SIGNALS

[75] Inventors: Alfred Fettweis, Bochum; Klaus Meerkoetter, Herne, both of Germany

[73] Assignee: Siemens Aktiengesellschaft, Berlin & Munich, Germany

[22] Filed: Apr. 17, 1975

[21] Appl. No.: 569,306

[30] Foreign Application Priority Data
Apr. 19, 1974   Germany............................ 2418923

[52] U.S. Cl. .............................. 235/152; 328/167; 333/70 R
[51] Int. Cl.² ...................... G06F 15/34; H03H 7/10
[58] Field of Search ........... 235/152, 156; 333/70 R; 328/165, 167

[56] References Cited
UNITED STATES PATENTS
3,749,895   7/1973   Kao...................................... 235/152
3,794,936   2/1974   Poschenrieder et al. ..... 333/70 R X OTHER PUBLICATIONS
A. Fettweis, "Pseudopassivity, Sensitivity, and Stability of Wave Digital Filters," IEEE Trans. on Circuit Theory, vol. CT-19, No. 6, 11-1972, pp. 668–673.

A. Fettweis, "Some Principles of ... Filters Imitating Classical Filter Structures," IEEE Trans. on Circuit Theory, vol. CT-18, No. 2, 3-1971, pp. 314–316.

*Primary Examiner*—Jerry Smith
*Attorney, Agent, or Firm*—Hill, Gross, Simpson, Van Santen, Steadman, Chiara & Simpson

[57] ABSTRACT

A wave digital filter comprising at least one filter section without delay elements, each port thereof having a positive port admittance, and the signal quantities therein being operated upon, preferably within certain individual multiport adaptors of the filter section, in such a way that the pseudo power, $$p(t_m) = \sum_{v=1}^{n} G_v [a_v^2(t_m) - b_v^2(t_m)],$$

received by respective adaptor ports $v$ of port admittance $G_v$ and associated with input quantities $a_v(t_m)$ and output quantities $b_v(t_m)$ at respective operating times $t_m$, is equal to or preferably only slightly greater than the value of the pseudo power function $p(t_m)$ which is obtained by omitting rounding or truncating, respectively, or overflow of the numbers being processed, and instead carrying out arithmetic operations precisely.

7 Claims, 28 Drawing Figures

Fig.13
$y = x_*$
Fig.14
$y = x^*$
Fig.15
$y = x^*_*$
Fig.16 $y = (x_1 + x_2)^*$
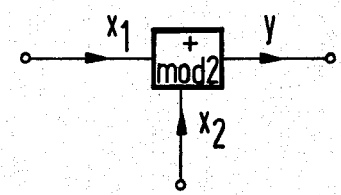

DIGITAL FILTER FOR ELECTRICAL SIGNALS

CROSS-REFERENCES TO RELATED APPLICATIONS

The present invention is of particular importance with respect to the subject matter of Fettweis U.S. application Ser. No. 402,348 filed Oct. 1, 1973 and Fettweis et al U.S. application Ser. No. 426,090 filed Dec. 19, 1973 (now U.S. Pat. No. 3,919,671 issued Nov. 11, 1975), and the disclosure of each of these applications is incorporated herein by reference.

SUMMARY OF THE INVENTION

The invention relates to a digital computer filter for electrical signals, with at least one circuit section being free of delay elements, and being in the form of a multiport circuit wherein each port is associated with a positive port admittance and with an input and output value at the respective operating times.

The invention is of particular importance for a so-called wave digital filter which represents the subject of the main patent application Ser. No. 402,348 and whereby the filter basic circuit corresponds to a conventional LC circuit for analog signals, preferably to a ladder circuit, whereby furthermore, reactive two terminal circuit elements (inductance, capacitance) are designed, preferably by employing scanning techniques, as single port circuits subject to transit time, and conductive elements are implemented as two port circuits subject to transit time, and whereby furthermore, nonreactive two terminal circuit elements (open circuits, short circuits, resistances, resistance-free sources and sources subject to resistance are designed as single port circuits not subject to transit time, and nonreactive multiport elements (transformers, gyrators, circulators) are designed as multiport circuits not subject to transit time, preferably also in accordance with scanning techniques, and whereby these single port and multiport circuits are switched together with impedance matching by means of individual adaptors (adaptor circuits) of the filter basic circuit.

Furthermore, the invention is of particular importance for further improvements of the invention according to the U.S. Pat. application Ser. No. 402,348 and also, in particular, for the improvement which is described in the U.S. Pat. application Ser. No. 426,090 now U.S. Pat. No. 3,919,671. It is essential for this improvement that at those circuit locations where a direct connection between two adaptor circuits is required, at least one has at least three ports, that for the adaptor circuits having at least three ports, the port provided for the direct connection has a decoupling between the input and output terminal due to the circuit-technical design of the adaptor circuit, and the port of the other adaptor circuit to be connected to the former has a port impedance due to its circuit-technical design, which port impedance corresponds to that of the decoupled port of the first adaptor circuit.

In the case of digital computer filters and thus also in the case of wave digital filters according to the main patent application, there is generally the problem of so-called limiting cycle oscillation. Parasitic oscillations in the computer filter are understood by limiting cycle oscillations. The cause for this lies in nonlinear effects which result from the limitation in the number of digit positions available in the filter for representing the numbers to be processed as electrical signal values.

The invention is based on the task to effectively eliminate these limiting cycle oscillations in the case of a digital computer filter, in particular, in the case of a wave digital filter according to the main patent application and its developments.

This task is solved according to the invention in the case of a digital computer filter of the initially explained kind in that in the multiport circuit, circuits for rounding, chopping and for the possible overflow of the numbers representing the signal values are provided in a basically known manner, and that these circuits are designed in such a way that the pseudo power function $$p(t_m) = \sum_{v=1}^{n} G_v[a_v^2(t_m) - b_v^2(t_m)]$$

received by the multiport circuit at each time $t_m$, is equivalent or preferably only somewhat greater than the value of the pseudo power function $p(t_m)$ which results if, by eliminating the rounding or chopping circuits, respectively, or the overflow, the arithmetic operations are carried out accurately, the foregoing symbols being defined as follows:

$v$ = integer variable designating respective ports 1, 2, ...,n
$a_v$ = input value at the time $t_m$ in the $v$ th port
$b_v$ = output value at the time $t_m$ in the $v$ th port
$G_v$ = port admittance of the $v$ th port.

It is recommended thereby to design the mentioned circuits in such a way that at least at some ports, the value of $b_v(t_m)$ does not exceed the value which would occur at these ports in the case of an exact execution of the arithmetic operations.

Regarding the construction of the circuit of the digital computer filter, it is advisable to select the same in such a way that the individual component elements process the signal parameters in floating point arithmetic or in fixed point arithmetic. Such component elements are basically known and used and therefore, they do not need to be explained in detail.

It is furthermore of particular importance that the multiport circuit according to the invention may be composed of several smaller multiport circuits, each of which being designed in accordance with the invention.

Other objects, features and advantages of the invention will be readily apparent from the following description of certain preferred embodiments thereof taken in conjunction with the accompanying drawings, although variations and modifications may be effected without departing from the spirit and scope of the novel concepts of the disclosure.

BRIEF DESCRIPTION OF THE DRAWINGS

FIG. 5b shows the wave flow diagram corresponding to FIG. 5a;

FIGS. 13 to 18 shows the interrelation between certain switching symbols and respective airthmetic operations, which switching symbols have not been previously known directly from the referenced main patent application;

DESCRIPTION OF THE PREFERRED EMBODIMENTS

Figure 1:
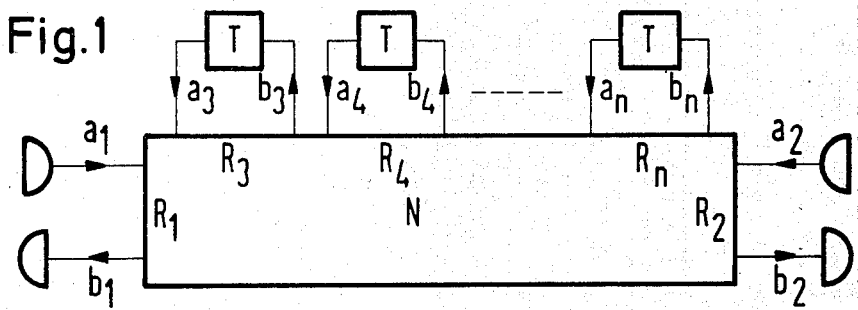
FIG. 1 shows a fully synchronous wave digital filter.

The following discussion of the present invention in section 1.2 hereof will refer to certain literature references which are identified by number in section 1.1.

1. Introductory Discussion of the Invention 1.1 Literature References (Refs.)

1. P. M. Ebert, J. E. Mazo, and M. G. Taylor, Overflow oscillations in digital filters, Bell System Technical Journal, vol. 48, pp. 2999–3020, November 1969

2. A. N. Willson, Jr., Limit cycles due to adder overflow in digital filters, IEEE Transactions on Circuit Theory, vol. CT-19, pp. 342–346, July 1972

3. J. F. Kaiser, Quantization effects in digital filters Proceedings of the 1973 IEEE International Symposium on Circuit Theory, pp. 415–417, Toronto, Ont.

4. S. Yakowitz and S. R. Parker, Computation of bounds for digital filter quantization errors, IEEE Transactions on Circuit Theory, vol. CT-20, pp. 391–396, July 1973

5. A. Fettweis, Digital filter structures related to classical filter networks, Arch. Elektr. Ubertrag., vol. 25, pp. 79–89, February 1971

6. A. Fettweis, Some principles of designing digital filters imitating classical filter structures, IEEE Transactions on Circuit Theory, vol. CT-18, No. 2, pp. 314–316, March 1971

7. A. Fettweis, Wave digital filters, Proc of the Tale Summer School on Circuit Theory, Institute of Radio Engineering and Electronics, Czechoslovak Academy of Sciences, pp. 11-1 to 11-10, Prague, 1971

8. A. Fettweis, Pseudopassivity, sensitivity and stability of wave digital filters, IEEE Transactions on Circuit Theory, vol. CT-19, No. 6, pp. 668–673, November 1972

9. A. Fettweis, Scattering properties of wave digital filters, Proceedings of the Florence Seminar on Digital Filtering, pp. 1–8, Florence, Italy, September 1972

10. R. E. Crochiere, Digital ladder structures and coefficient sensitivity, IEEE Transactions on Audio and Electroacoustics, vol. AU-20, pp. 240–246, 1972

11. A. Chu and R. E. Crochiere, Comments and experimental results on optimal digital ladder structures, IEEE Transactions on Audio and Electroacoustics, vol. AU-20, pp. 317–318, 1972

12. A. Sedlmeyer and A. Fettweis, Digital filters with true ladder configuration, International Journal of Circuit Theory and Applications, vol. 1, pp. 5–10, 1973

13. A. Sedlmeyer and A. Fettweis, Realization of digital filters with true ladder configuration, Proceedings of the 1973 International Symposium on Circuit Theory, pp. 149–152, Toronto, Ont.

14. K. Renner and S. C. Gupta, On the design of wave digital filters with low sensitivity properties, IEEE Transactions on Circuit Theory, vol. CT-20, pp. 555 567, September 1973

15. L. B. Jackson, J. F. Kaiser, H. S. McDonald, An approach to the implementation of digital filters, IEEE Transactions on Audio and Electroacoustics, vol. AU-16, No. 3, pp. 413–421, September 1968

16. S. K. Tewksbury, Special purpose hardware implementation of digital filters, Proceedings of the 1973 IEEE International Symposium on Circuit Theory, pp. 418–421, Toronto, Ont.

17. B. Liu and M. E. Van Valkenburg, On round-off error of fixed-point digital filters using sign-magnitude truncation, Digest of Technical Papers, London 1971 IEEE International Symposium on Electrical Network Theory, pp. 68–69

1.2 Introductory Discussion

In a computer filter operating on a digital basis, the signal values to be processed are converted in a known manner by means of a scanning circuit into periodically successive scanning values, and these scanning values are usually not processed directly as discrete amplitude values (pulses) but in the form of corresponding binary numbers in parallel or series code. A corresponding reconversion into electrical analog signal values is then carried out at the output side of the filter. So-called quantization noises or distortions, respectively, occur during this repeated conversion which can be reduced to a desired and tolerable degree by means of a correspondingly sensitive (delicately stepped) quantization. The more sensitive the quantization process is carried out in order to keep this quantization noise small, the more digits are needed for the binary number which describes the individual scanning value. Due to the finite word length which is available within a computer filter for the representation of the signal or the data parameters, respectively, additional distortions occur within the filter which distortions are the cause for the initially mentioned nonlinear oscillations. These distortions are due to the fact that, for example, when adding up two binary numbers, the sum of the digits may be increased each time by one digit per addition, while in the case of multiplication the digit number of the result is equivalent to the sum of digit numbers of the two values to be multiplied with each other, and that remaining word lengths exceed the available digit numbers of the individual adders and multipliers in the filters or at certain points of the filter. Therefore, the digit numbers within the filter should generally be selected as high as possible in the adders and multipliers in order to keep this additional noise as low as possible. Nevertheless, due to the inevitable finiteness of the available digits, the tendency toward oscillating, which is founded in this nonlinearity, in general cannot be suppressed, since a sufficiently great triggering by the signal value is already enough to make effective the corresponding nonlinearities within the filter which then lead to a self-excitation of the filter at frequencies within or without the pass range (transmission band). These oscillations are also distinguished ty two kinds, namely overflow oscillations which are due to the fact that the result of arithmetic operations within the filter exceeds the available range within the individual arithmetic units, and granulation oscillations which develop in the computer filter due to truncating the numbers to a fixed number of digits during the individual arithmetic operations, in particular during multiplications and which correspond to a type of additional coarsening quantization.

In conventional digital filters, overflow oscillations can be eliminated in that, for example, a so-called saturation arithmetic (references 1 and 2) is employed. A remedial measure as regards the granulation is known hitherto only in that certain limitations for the amplitudes of these oscillations were introduced (References 3 and 4). Due to the complexity of the mathematical relations employed therein, the essential results of this technique have been limited up to now to filter sections or partial filters which do not exceed the degree two. True, more complicated filter characteristics may be realized too, namely by way of connecting such filter sections in series if necessary, together with filter sections of the first degree; however, filter sections or partial filters of a higher degree are virtually entirely excluded.

In particular with wave digital filters (references 5 to 14), which will be identified hereinbelow as WD filters, the individual filter is generally designed as a complete block, by means of which the inner coupling structure has a greater order of magnitude than two. The solution according to the invention of the problem of avoiding the mentioned parasitic oscillations makes it also possible to achieve with such filters stability conditions which are sufficient. This will be explained in the following paragraphs by means of a general theory and by means of certain basic circuit examples, whereby both apply for so-called fully synchronous as well as for semi-synchronous WD filters. A fully synchronous WD filter is a computer filter whereby the individual arithmetic operations take place in the cycle of the operating frequency simultaneously with the operating times $t_m$. In the case of a semi-synchronous computer filter, the arithmetic operations take place in the computer filter, namely also in the cycle of the operating frequency, however, not simultaneously but with certain shiftings in phase. The case of the fully synchronous filters will be dealt with hereinbelow in Section 2 and the case of the semi-synchronous filters in Section 3.

The possibility for the derivation of the constructional requirements to be kept in the filter for achieving stability is achieved by the utilization and generalization of the basic idea of pseudo power and pseudo passivity which was introduced some time ago for the examination of desired properties in the linear behavior of WD filters (references 8 and 9). In detail, a square power positive function is introduced for this which will be designated hereinbelow also as stored pseudo power function and which must necessarily decrease if stability is to be given. In the mathematical terminology this pseudo power function corresponds to a Liapuno function. It might be mentioned in addition that the question of stability is briefly dealt with already in reference 8. However, the case dealt with therein relates to a WD filter for which the precondition applies that no overflow, or rounding or truncation, respectively, has to be introduced since any desired digit numbers for the signal values to be processed within the filter structure are available. Thus, it is merely shown therein that in such a filter a priori limiting cycle oscillations cannot occur.

It may be mentioned furthermore that for the realization of digital computer filters, nowadays always the so-called fixed point-two's complement-arithmetic is employed. This arithmetic or circuit technique, respectively, is described in detail in references 15 and 16 so that here a detailed commenting or explanation can be eliminated. It might be said furthermore that the application of the rules of the design according to the invention can be made in a particularly simple manner for the formation of the adaptor circuits as well as for the scaling in that a specific kind of arithmetic (computation) and thus a specific type of switching is provided for the various types of chopping operations. This is explained in detail in section 4, and the application of this type for the construction of the adaptor circuit is explained in Section 5 and for the scaling in Section 6. The adaptor circuits are the adaptors mentioned in the referenced main patent application. By scaling is understood the generally known measure for computer filters, whereby within the filter, signals having a too high or too low value are broadened to a suitable value range by means of a transformer-like translation.

2. Definition and Properties of the Pseudo Power Stored in Fully Synchronous Wave Digital Filters 2.1 Stored Pseudo Power WD filters having a genuine ladder structure as well as most conventional digital filters operate fully synchronously, whereas WD filters whose reference filters comprise "unit elements" or "quasi-reciprocal lines", may be of the semi-synchronous type. Quasi-reciprocal lines are identified in the technical literature frequently as Quarl's.

In this section, only fully synchronous WD filters are dealt with. As shown in FIG. 1, a filter of this type can be illustrated generally. It is presumed in the illustration that the filter is constructed as a two port. As shown in Section 7 by the remarks 6, this simplified assumption is of no importance for the validity of the present theory. The blocks identified with the symbol T represent the delay elements all of which having the same delay time $T > 0$. Furthermore, it is assumed that in the delay-free n-port designated by the symbol N in FIG. 1, all arithmetic operations are carried out simultaneously at the times $$t_m = t_o + m \cdot T; m = \ldots, -2, -1, 0, 1, 2, \qquad (1)$$

Therefore, the timing frequency (rate of operation) is given by $$F = 1/T \qquad (2)$$

The instantaneous value of the signal entering the port $v = 1, 2, \ldots, n$ with the port impedance $R_v$ is identified with $a_v = a_v(t)$ and the instantaneous value of the reflected signal is identified with $b_v = b_v(t)$. Under normal conditions, the value $b_1$ is insignificant and $a_2 = 0$. Each $R_v$ is associated with a port admittance $G_v = 1/R_v$. The signals $a_1$ and $a_2$ are identified as input signals and the signals $b_1$ and $b_2$ as output signals.

Figure 2:
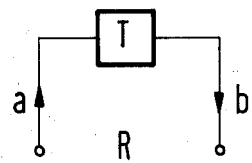
FIG. 2 shows a delay element T which is connected to a port with the port impedance R.

First, a single delay element will be examined which is connected to a port having a port admittance $G = 1/R$. This case is shown in FIG. 2. The pseudo power function stored in the delay element during a time interval $(t_m, t_{m+1})$ is then determined by $$p(t_m) = G a^2(t_m). \tag{3}$$

Accordingly, the pseudo power function, which is stored in the delay elements of the filter shown in FIG. 1 during the time interval $(t_m, t_{m+1})$ is defined by $$p(t_m) = \sum_{v=3}^{n} G_v b_v^2(t_m) \tag{4}$$

It has to be considered thereby that the symbol $a$ now relates to a signal which occurs in N.

The port impedances in a WD filter are usually all positive, i.e.

$$R_v > 0, G_v > 0, v = 1, 2, \ldots, n. \tag{5}$$

Furthermore, it is assumed that these relations are generally maintained for which we would like to refer to remark 5 in Section 7. The pseudo power function $p(t)$ is thus a non-negative function of the time which is defined for the moment $t = t_m$ which is given by the relation (1).

The increase of $p(t)$ at the moment $t_m$ is given by $$\Delta p(t_m) = p(t_m) - p(t_{m-1}), \tag{6}$$

since for the connection between $a_v(t)$ and $b_v(t)$ on a delay element, the relation $$a_v(t_m) = b_v(t_{m-1}), v = 3, 4, \ldots, n. \tag{7}$$

is applied and for $\Delta p(t_m)$ the relation $$\Delta p(t_m) = \sum_{v=3}^{n} G_v [b_v^2(t_m) - a_v^2(t_m)] \tag{8}$$

On the other hand, the power taken up by the n-port N is defined, according to the statements in reference 8, to be $$P_N(t_m) = \sum_{v=1}^{n} G_v [a_v^2(t_m) - b_v^2(t_m)]. \tag{9}$$

Thus, by including relation (9) in relation (8) one obtains $$\Delta p(t_m) = -P_N(t_m) + \sum_{v=1}^{2} G_v [a_v^2(t_m) - b_v^2(t_m)] \tag{10}$$

In particular, one obtains from this for the case of vanishing input signals (i.e., $a_1 = a_2 = 0$) the relation $$\Delta p(t_m) = -P_N(t_m) - G_1 b_1^2(t_m) - G_2 b_2^2(t_m). \tag{11}$$

Therefore, if N is pseudo positive, i.e.

$$P_N(t_m) \geq 0 \text{ for all } m, \tag{12}$$

the unbalanced equation (inequality)

$$\Delta p(t_m) \leq -G_1 b_1^2(t_m) - G_2 b_2^2(t_m) \leq 0 \tag{13}$$

results for $\Delta p(t_m)$.

In practice, the n-port N consists of a number of individual multiports $N_k$, with $k = 1, 2, \ldots K$. The term $P_k(t_m)$ will be the pseudo power function recorded (taken up) by $N_k$ at the moment $t_m$; this term is given by an expression corresponding to the relation (9) by making reference to $N_k$ instead of N. From the theorem 2 stated in reference 8 it follows that for each moment $t_m$ the following relation applies $$P_N(t_m) = \sum_{k=1}^{K} p_k(t_m). \tag{14}$$

Figure 3:
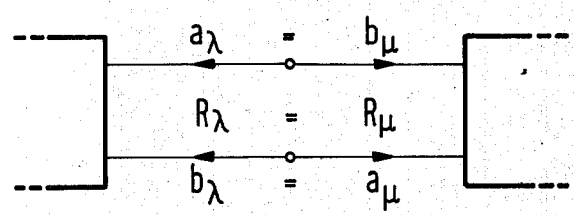
FIG. 3 shows the connection of two ports $\lambda$ and $\mu$.

This is a result of the fact that for two ports $\lambda$ and $\mu$ which are connected with each other corresponding to FIG. 3, the following conditions apply:

$$R_\lambda = R_\mu, a_\lambda = b_\mu, b_\lambda = a_\mu. \tag{15}$$

From (14) it follows that the relation expressed in (12) is valid with certainty if the $N_k$ are pseudo passive, i.e., if $$P_k(t_m) \geq 0 \text{ for all } k = 1 \text{ to } K \text{ and all } m \tag{16}$$

The components $N_k$ occurring in the practice are adaptors, ideal transformers, gyrators and circulators. These components are energy neutral, i.e., not only delay free but also pseudo-loss free (reference 8) so that for all $m$, $p_k(t_m) = 0$ applies.

In the case of inequality (12), the equal sign is valid in this case.

2.2 Stability criteria

In the latter part of the preceding section, ideal linear arithmetic operations were presumed. Due to the finite number of bits which are available for the representation of the signal values, non-linearities appear in practice which cannot be avoided. These non-linearities have no influence upon the relations applying for the delay elements so that (7), (8) and (10) still hold true. They influence neither the port impedances nor the signal values in FIG. 3 so that (15) and thus also (14) remain valid.

The WD filter shown in FIG. 1 will now be examined and it is assumed that the just discussed non-linearities, which are present on account of the finite signal value length, are effective in the n-port N. It is further assumed that at a given time $t_o$, any desired signal values are stored in the delay elements and that for $t \geq t_o$ the input signals $a_1$ and $a_2$ are zero (autonomous system). The filter is considered output stable if, after a finite time the output quantities $b_1(t_m)$ and $b_2(t_m)$ continuously exhibit the value zero. On the other hand, the filter is to be completely stable if after a finite time, all $b_v(t_m)$ continuously exhibit the value zero.

Output stability thus presupposes the freedom from detectable oscillations. The complete stability presupposes the absence of any detectable or nondetectable oscillation. A realizable digital filter does not comprise any delay free loops, which can be learned fom references 5 to 7. From this follows that an n-port N, which is delay free, cannot include closed loops. Therefore, no oscillations can occur in the n-port N which would not be detectable at least at one $b_v$.

The following theorem may be formulated for the case of output stability.

THEOREM 1

A WD filter as shown in FIG. 1 is output stable if its n-port N is pseudo passive. The proof for this can be given in consideration of the fact that a digital filter can accept only a finite number of different conditions. Under autonomous circumstances, after a finite number of pulses, it must therefore go into a state which it had taken once before. Therefore, each signal value in a digital filter must execute periodic oscillations after a finite time or it must be continuously zero. If the output quantities (values) proceed periodically with an amplitude which is different from zero, $p(t_m)$ would then decrease upon each oscillatory cycle, on account of the validity of (13) by a positive value which, however, is not convergent with respect to zero. This would assume that after a finite number of oscillations, $p(t_m)$ becomes smaller than zero. This is not possible according to (4) and (5).

Figure 4:
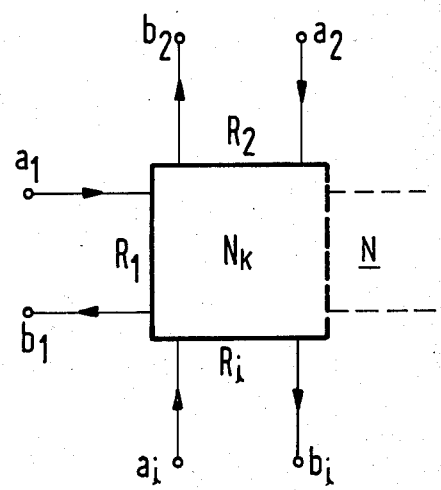
FIG. 4 shows a multiport component block $N_k$ which may be considered as one of K constituent multiports together forming the block N of FIG. 1; the block $N_k$ also being designated as block N when the number of ports $i$ of $N_k$ is equal to $n$.

Therewith, the first important stability criterion was obtained. Next, the n-port N which is illustrated in FIG. 4, will be considered. Since it is not necessary to closer identify the moments $t_m$, the pseudo power function received (taken up) by N is indicated instead of the expression (9):

$$P_N = \sum_{v=1}^{n} (a_v^2 - b_v^2)G_v. \qquad (17)$$

The term $b_v$ designates the output signals which are computed in the arithmetic with a finite word length, and $b_{v_0}$ designates the output signals which occur under ideal conditions, i.e., if the additions and multiplications in N are executed accurately. It will be assumed furthermore that N is pseudo passive in the linear case, i.e. $p_n \geq 0$, if the term $b_v$ in (17) are replaced by the terms $b_{v_0}$.

According to (17) a sufficient condition for the continuous guarantee of the pseudo passivity of N is obtained if the non-linear modifications are carried out in such a manner—for the same $a_v$ — that the quantity of $b_v$ conforms to the relation $$|b_v| \leq |b_{v_0}|, v = 1 \text{ to } n. \qquad (18)$$

This condition is also valid in the extreme but possible case that N is pseudo loss free under ideal linear conditions, i.e. $P_N = 0$. The results leads to the following theorem:

THEOREM 2

A WD filter is output stable if its n-port N is pseudo passive under ideal linear conditions and if the non-linearities, which are caused by the arithmetic working with a finite word length, are so effective that (18) is valid (compare FIG. 4).

It is now possible to indicate a criterion for complete stability, namely as

THEOREM 3

A WD filter (FIG. 1) is completely stable, if, in addition to the requirements of theorem 2, a complete stability in the linear case would be existing.

The proof for this can be given as follows: Firstly, it is assumed that oscillations exist having the property $b_v(t_m) = b_v(t_m)$ for $v = 1$ to $n$ and all $m$. Hence, in this case all signal values coincide with those under ideal linear conditions, i.e., non-linearities do not appear. On account of this presupposition, oscillations are excluded. Let us assume that at least for one $v$ and at least at one time $(t_m)$ during an oscillation period, the relation $$|b_v(t_m)| < |b_{v_0}(t_m)|$$

applies; it would follow in this case from (9) that $P_N(t_m)$ exhibits a positive value at least once per oscillation cycle. According to the proof of theorem 1 it thus is clear that $p(t_m)$ should be smaller than zero even for $b_1(t_m) = b_2(t_m) = 0$, which is impossible. As it was stated at the beginning of this sub section, equation (14) holds true even if N is composed of individual blocks $N_k$. Thus, the following conclusion can be drawn.

It is assumed that N (FIG. 1 and FIG. 4) is composed of individual multi-port circuits $N_k$ in such a way that the relation (15) is fulfilled. Then, each of the theorems 1 to 3 are considered to be fulfilled when the conditions required for N are fulfilled for each individual $N_k$. Thereby, it is to be considered in particular that it becomes necessary on account of the theorems 2 and 3, to fulfill for example the condition 18 not only for the ports of N but for all ports of each $N_k$.

3. Extension to Semi-synchronous Wave Digital Filters

Figure 5A:
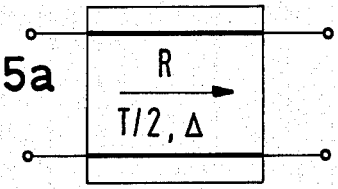
FIG. 5a shows the representation of QUARL'S.
Figure 5B:
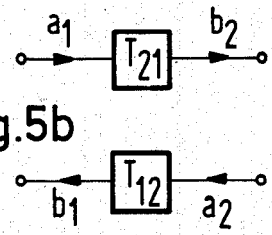

Semi-synchronous wave digital filters occur when the reference filters which are associated with the WD filters, comprise "unit elements" or more generally "QUARL'S". A Quarl having the characteristic impedance R, a mean delay time T/2 and a differential delay $\Delta$ (compare FIG. 5a) leads to a two port with the port impedance R whose wave flow diagram is illustrated in FIG. 5b and which has two delays (delay elements) $T_{21} \geq 0$ and $T_{12} \geq 0$, for which applies $T_{21} = T/2 + \Delta$, $T_{12} = T/2 - \Delta$. For $\Delta = 0$, the QUARL becomes a unit element. For this reason, the unit element will not be considered specifically in the following.

Figure 6A:
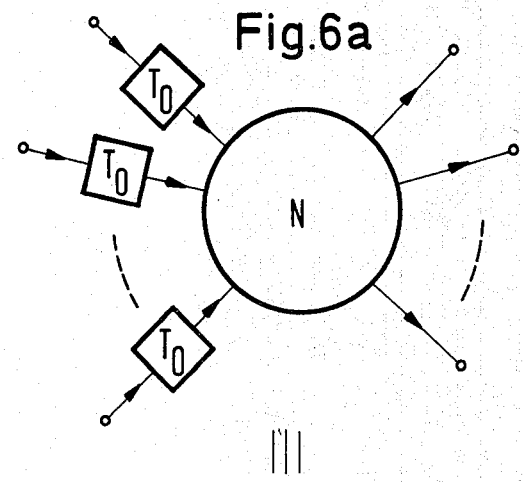
FIGS. 6a and 6b shows two equivalent signal delay circuits which are distinguished merely by the switching-on position of the delays.
Figure 6B:
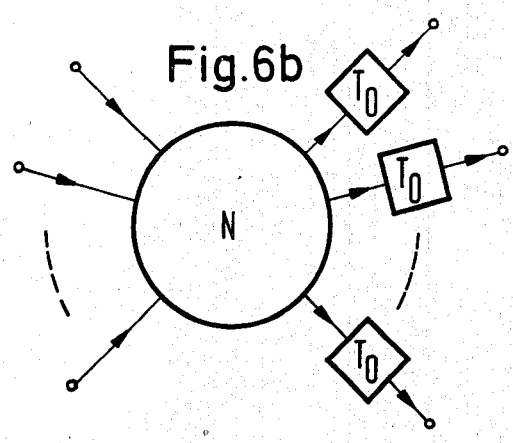

The semi-synchronous WD filters occuring in practice can be transformed very easily into equivalent fully synchronous WD filters. For this purpose, use can be made of the equivalence of the wave flow diagrams shown in FIGS. 6a and 6b. In FIGS. 6a and 6b, N represents any desired multiport (e.g., an adapter or an adapter circuit, respectively) and $T_o$ is any desired delay time (compare for instance reference 10). The reason that this transformation into a fully synchronous WD filter can be executed, is explained by the fact that each closed loop in a realizable WD filter must show a delay time which corresponds to an integral multiple of the scanning time T (compare for example references 5 to 15). By means of the described transformation, delay times may even be included in the input and output lines which are not an integral multiple of T or which are negative. From the practical viewpoint, delays in the input and output lines are unimportant so that they may be omitted. The remaining structure corresponds to the desired fully synchronous WD filter.

The mathematical operations which are performed in the interior of N by the individual electrical components, are not affected by the transformation shown in FIGS. 6a and 6b. The errors resulting due to overflow and rounding or clipping (chopping) do not change. The results disclosed in Section 2 as regards the stability, remain valid even for a fully synchronous WD filter, which is obtained by employing the equivalence illustrated in FIGS. 6a and 6b, and for the original semi-synchronous WD filter.

Figure 7:
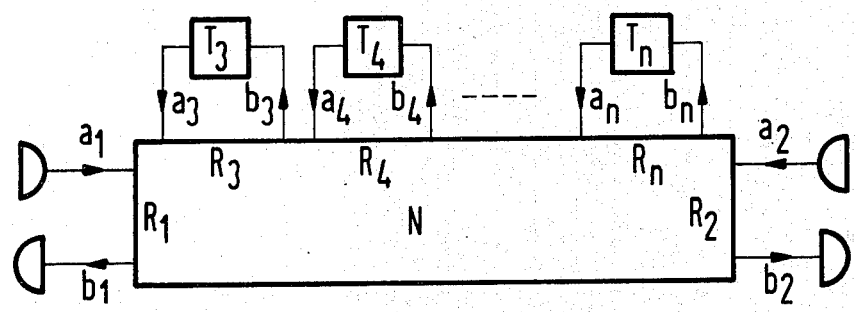
FIG. 7 shows a wave digital filter with delay elements $T_3$ to $T_n$.
Figure 8:
FIG. 8 shows an example for operating times which are distributed irregularly within one time period T.

One can obtain the same result even without employing the described equivalence. For this purpose, one considers the WD filter illustrated in FIG. 7 having the delay elements $T_3, T_4, \ldots T_n$, all of which may have a different delay time. The moments $t_m$ in which the arithmetic operations are executed are no longer described by a simple expression such as (1) even though they still form periodic series. However, a positive integral number $r$ exists so that $$t_{m+r} - t_m = T \text{ for all } m,$$

and, the intervals within one period T do not have to be uniform (FIG. 8), i.e. the time intervals $t_{m+i} - t_{m+i-1}$ may differ from one another for each $i = 1, 2, 3, \ldots r$. At the moment $t_m$, only a few of the multipliers and adders of the circuit are operating, but each of them operates exactly only once during the $r$ moments $t_{m+i}$ of the semi-open interval $(t_m, t_m + T)$. During each interval $(t_m, t_{m+1})$ the signals in all delay elements remain constant. But at each moment $t_m$ some of these signals may change.

For a given $v$, the signals $a_v(t_m)$ and $b_v(t_m)$ are basically defined only for moments which follow each other at an interval of a full period T. One can define them for all $t_m$, namely in such a way that $a_v(t_m) = 0$ in the case that no signal was taken from $T_v$ and thus fed into N at the time $t_m$, and $b_v(t_m) = 0$ in the case that no signal is fed into $T_v$ at the time $t_m$.

Figure 5C:
FIG. 5c shows a circulator which can be obtaint by pulling out the delay elements in FIG. 5b.

Now, the expression (4) can be made more general and the pseudo power function can be defined which is stored in the delay elements during the interval $(t_m, t_{m+1})$ by $$p(t_m) = \sum_{v=3}^{n} G_v x_v^2(t_m)$$

whereby $x_v(t_m)$ are those signals which are stored in $T_v$ during $(t_m, t_{m+1})$. The increase of $p(t_m)$ at the times $t_m$, i.e., the expression in the definition according to (6) is then still given by (8) if the $a_v(t_m)$ and $b_v(t_m)$ are defined in the above indicated manner. Otherwise, the stability demonstrations stated in 2.1 and 2.2 remain valid. In this connection it might be pointed out that, as it can be taken from FIG. 5b, a QUARL from which two delays are pulled out is reduced to a circulator (compare FIG. 5c). Thus, the n-port N is composed of the components having no delay and of the circulators, which are derived from the QUARL.

The reason for using semi-synchronous WD filters is to be seen among other things, in the flexibility in which the succession of the arithmetic operations is to be carried out, and in the thereby opened possibility of a time multiplex or multiple exploitation, respectively, of the electrical circuit components. For details of this, we are referring to reference 15.

4. Pseudo Passivity of Energy-Neutral Components in Consideration of a Finite Signal Word Length 4.1 General Data As starting basis for the consideration serves the multi-port N illustrated in FIG. 4 which does not necessarily have to be identical with the n-port N illustrated in FIG. 1, but may be a partial component of the same. It is assumed that under ideal conditions it is pseudo passive. According to the statements in Section 2.2, the condition (18) is to be fulfilled for $N_k$, FIG. 4.

The fulfillment of condition (18) can be easily realized in practice. The variable m may be the number of bits available for the representation of signals between the components, i.e., in particular for $a_v$ and $b_v$. By means of sufficiently increasing the number of bits for the signal representation within N, it can be guaranteed that the arithmetic operations in N are executed accurately, i.e., the output signals receive the exact values $b_{v_0}$. This is possible in view of the higher valent bits as well as in view of the lower valent bits. From these $b_{v_0}$, numbers $b_v$ can then be determined by employing simple operations, which numbers fulfill the condition (18) and which are representable with m bits or with the available word length m, respectively, with the smallest possible error.

The increase of bits for the signal representation within the adaptors does not have to be very great. This is based on the fact that in the practice a signal path in a component block N usually leads at the most over a multiplier and a few adders. The increase in complexity is restricted in many cases to a limited range of N as it will be shown hereinbelow in Section 5.

4.2 The Two's Complement Arithmetic

The previously discussed results are valid for any finite arithmetic. in the following it will be assumed that the signals between the components of a WD filter are represented as fixed point values in the two's complement form (compare references 15 and 16). The value of a number represented by m bits $\delta_0, \delta_1, \ldots, \delta_{m-1}$ is given by $$-\delta_0 + \sum_{\mu=1}^{m-1} \delta_\mu 2^{-\mu} \qquad (19)$$

The highest value which this number can have is $1 - 2^{-m+1}$ and the lowest one is $-1$. If the number of bits is increased, (19) can be replaced by $$x = \delta_{-k} 2^k + \sum_{\mu=-k+1}^{m+l-1} \delta_\mu 2^{-\mu}, \qquad (20)$$

with $k \geq 0$ and $l \geq 0$. The highest value which can be assumed by $x$ in this case is $2^k(1 - 2^{-k-l-m+1})$, and the lowest value is $-2^k$.

In order to employ in a simple manner the results achieved up to now, a special notation is introduced now. The variable x will be a number which is given by (20). With $x_*$ will be identified the number $$x_* = -\delta_{-k} 2^k + \sum_{\mu=-k+1}^{m-l} \delta_\mu 2^{-\mu} \qquad (21)$$

which is obtained by rear chopping, i.e., by chopping the bits $\mu = m$ to $m + l - 1$. Correspondingly, with $x^*$ is designated the number $$x^*_* = -\delta_0 + \sum_{\mu=1}^{m+l-1} \delta_\mu 2^{-\mu} \qquad (22)$$

which is obtained by front chopping, i.e., by chopping the bits $\mu = -k$ to $-1$. The number which is obtained by rear and front chopping is designated with $x^*_*$. A number of this type is given by (19).

Considered is now a signal $b_{v_0}$ which will be given by an expression of the form (20) with $k = 0$ and $l > 0$. A signal $b_v$ of the form (19) which satisfies the condition (18) is given by signmagnitude truncation, i.e., $$b_v = (b_{v_0})^* + \gamma_v \qquad (23)$$

whereby $$\gamma_v = 0 \text{ for } \delta_0 = 0 \qquad (24)$$

and for $\delta_0 = 0$, (25a)

$$\gamma_v = \begin{cases} 0 & = \text{if } \delta = 0 \text{ for } \mu = m \text{ to } m + l - 1 \\ -m+1 \\ 2 & \text{otherwise} \end{cases} \qquad (25b)$$

The selection $\gamma_v = 2^{-m+1}$ can be combined with the condition (18) even for the case $\delta_0 = 1$ and $\delta_\mu = 0$ for $\mu = m, \ldots, m + l - 1$; however, it contributes to a slight increase of the error. Therefore, (25a) is replaced by the somewhat more general condition 1. (26)

$$\gamma_v = 0 \text{ or } 2^{-m+1} \text{ if } \delta_\mu = 0 \text{ for } \mu = m \text{ to } m + l - 1.$$

The choice between the two possibilities in (26) can be made as is desired. In the practical case, that possibility is recommended which leads to the simplest hardware realization.

Figure 9A:
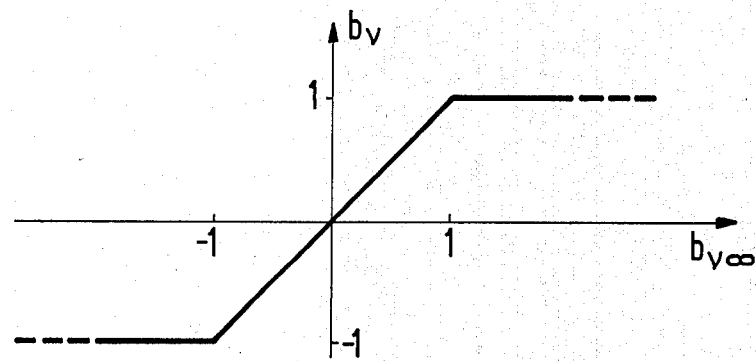
FIG. 9a shows the overflow reduction of a number $b_{v_0}$ to a number $b_v$ in an acceptable range, namely by means of a saturation characteristic.

Next shall be assumed that $b_{v_0}$ is given by an expression of the form (20) with $b_{v_0} \geq 1$ or $b_{v_0} < -1$. In both cases any number $b_v$ of the condition (18) is sufficient, which number can be represented by (19). The smallest error results if in the first case $b_{v_0}$ is replaced by $1 - 2^{-m+1}$ and if in the latter case $b_{v_0}$ is replaced by $-1$, by neglecting the granularity if use is made of the limiting characteristic as shown in FIG. 9a.

Figure 9B:
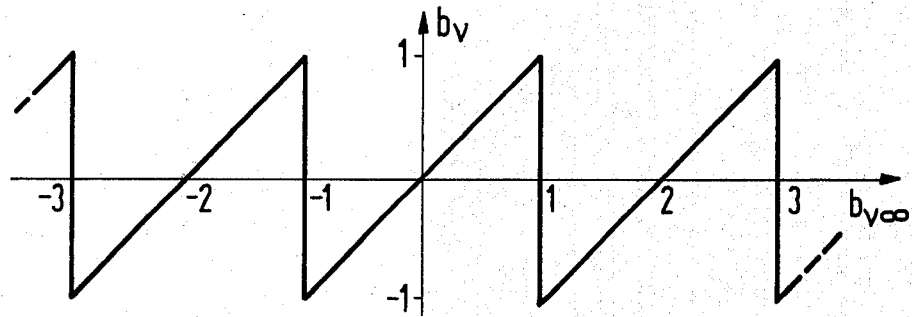
FIG. 9b shows the same processs by means of a "modulo-2" characteristic.

A simpler solution is obtained if instead of the limiting characteristic, the sawtooth characteristic shown in FIG. 9b is used which, for example, is achieved automatically in a two's complement adder for which we are referring to reference 15. The arithmetic operations are then carried out as modulo $-2$ - operations, i.e., the output result is formed in such a way that an integral multiple of 2 is added to the sum or subtracted from it, namely in such a way that the result falls into the acceptable range $(-1, 1)$ (modulo $-2$ - addition). Thus, $b_{v_0}$ is replaced by $(b_{v_0})^*$, whereby the * indicates the operation which is expressed in (22). If not only $k$ is $> 0$, but also $l > 0$, a rear chopping must be applied in addition.

A summary of the results up to now shows that for $k \geq 0$ and $l \geq 0$ a simple and suitable possibility for the fulfillment of condition (18) exists by $$b_v = c_v + \gamma_v, \; c_v = (b_{v_0})^*_* \qquad (27)$$

whereby $\gamma_v$ is given by (24), (25a) or (26) and (25b).

4.3 Arithmetic Rules For Chopping Operations

In the last Section was shown how signals $b_v$, which satisfy the condition (18), can be obtained at the outputs of a component N (FIG. 4). In practice, however, the necessary operations can be executed already in earlier states within N. This signifies a considerable saving for the technical realization. The following arithmetic rules may be used for an easy determination of the chopping operation to be executed within a component. Due to their clarity, most of the stated arithmetic rules do not require explicit demonstration. It is assumed that the numbers $x_v$ with $v = 1, 2, \ldots n$ relates to numbers in the form of (20).

RULE 1:

The order in which the front and rear chopping is carried out is of no importance, i.e., $$x^*_* = (x_*)^* = (x^*)_*$$

RULE 2:

If $x_{v_0} = x_v$ for all $v = 1, 2, \ldots n$, then the following applies:

$$(x_1 + x_2 + \ldots + x_n)_* = x_{1*} + x_{2*} + \ldots + x_{n*}.$$

RULE 3:

If $x_{v*} = x_v$ for $v = 2$ to $n$, then the following applies:

$$(x_1 + x_2 + x_3 + \ldots + x_n)_* = x_{1*} + x_2 + x_3 + \ldots + x_n.$$

RULE 4:

The value of $y = (x_1 + x_2 + \ldots + x_n)^*$ remains unchanged if any one of the $x_v$ is replaced by $x_v^*$.

The value $\bar{x}$ is the number which is obtained in (20) when each $\delta_\mu$ is replaced by its complement $\bar{\delta}_\mu = 1 - \delta_\mu$ so $$\bar{x} = -\bar{\delta}_k 2^k + \sum_{\mu=k+1}^{m+l-1} \bar{\delta}_\mu 2^{-\mu}. \qquad (28)$$

The calculation of this expression must be done carefully since for $x = x_*$, that is if $\delta_\mu = 0$ for $\mu = m$ to $m+l-1$ with $l > 0$ becomes $\bar{x} \neq \bar{x}_*$. This can be seen easily if (28) is compared with the following expression obtained from (21), according to $$\bar{x}_* = -\bar{\delta}_k 2^k + \sum_{\mu=-k+1}^{m-1} \bar{\delta}_\mu 2^{-\mu}. \qquad (29)$$

RULE 5:

Applied is $$(-x)_* = \begin{cases} -x_* - 2^{-m+1} = \bar{x}_* \text{ if } x_* \neq x & (30a) \\ -x_* \quad -m+1 \text{ if } x_* = x & (30b) \\ -x_* = \bar{x}_* + 2 \end{cases}$$

The proof for this result follows from $$-x = -\bar{\delta}_k 2^k + \sum_{\mu=-k+1}^{m+l-1} \bar{\delta}_\mu 2^{-\mu} + 2^{-m-l+1},$$

and $$-x_* = -\bar{\delta}_k 2^k + \sum_{\mu=-k+1}^{m-1} \bar{\delta}_\mu 2^{-\mu} + 2^{-m+1}. \quad (31)$$

RULE 6:

Applied is $(-x)^* = -x^*$.
This can be checked easily by way of (22) and (31).

RULE 7:

The operation $$y = (x_1 + x_2 + \ldots + x_n)^*$$

identifies the modulo $-2$-addition of the $x_v$ with $|y| \leq 1$. If $x_v = x_v^-$ for $v = 1$ to $n$, then $y$ corresponds exactly to the result which is obtained with the two's-complement-addition of $x$.

5. Pseudo Passivity of Adaptors Which Operate With Two's Complement Arithmetic

5.1 Energy Neutral Components

The application of the results obtained in Section 4 is examined in Sections 5.2 and 5.3 as to ideal energy neutral components of a WD filter. Circulators do not have to be considered further in the following since they do not include arithmetic operations which can be seen from reference 5 to reference 7 and, e.g., from FIG. 5c. Gyrators and ideal transformers with the translation ratio of $-1:1$ require only multiplication with $-1$ and are thus covered by the rules 5 and 6 of Section 4.3.

The reflected signal $b_{v_0}$ occurring under ideal conditions at the output of an n-port parallel adaptor are given, according to references 5 to 7, by $$b_v = a_o - a_v, \; a_o = \alpha_1 a_1 + \alpha_2 a_2 + \ldots + \alpha_n a_n \quad (32a,b)$$

$$\alpha_v = 2G_v/G, \; G = G_1 + G_2 + \ldots + G_n, \quad (33a,b)$$

For the output signals of an n-port series adaptor are likewise valid the relations corresponding to references 5 to 7

$$b_v = a_v \alpha_v a_o, \; a_o = a_1 + a_2 + \ldots + a_n, \quad (34a,b)$$

$$\alpha_v = 2R_v/R, \; R = R_1 + R_2 + \ldots + R_n, \quad (35a,b)$$

whereby in both cases the multiplier-coefficients $\alpha v$ fulfill the condition $$\alpha_1 + \alpha_2 + \ldots + \alpha_n = 2. \quad (36)$$

Ideal transformers with a translation ratio which is different from $-1:1$ can be obtained either by employing a two-port adapter (compare references 5 to 7) or by using two multipliers (compare Section 6).

5.2 Adaptors With Only One Multiplier

The results achieved in Section 4 can be employed particularly well on adaptors comprising only one multiplier. It was found that for this, only a slight additional expenditure of hardware is required. This result is particularly interesting if one considers that each adaptor such as adaptor N, FIGS. 1, 6a, 6b and 7, can be constructed of adaptors such as the K multiport adaptors $N_k$, FIG. 4, each of which contains only one multiplier.

Figure 10A:
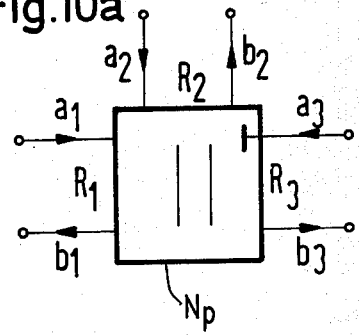
FIG. 10a shows a three port parallel adaptor whose port 3 is reflection-free (decoupled)

In a three-port parallel adaptor (compare reference 12 and 13) with a reflection-free port, one of the multiplier coefficients $\alpha_v$ equals 1, e.g., $\alpha_3$ may equal 1 (compare $N_p$, FIG. 10a which may be a constituent of adaptor N). From (36) results:

$$\alpha_1 + \alpha_2 = 1. \quad (37)$$

In consideration of (5) and (33) it can be assumed without restricting the generality that $$0 < \alpha_1 \leq \tfrac{1}{2} \quad (38)$$

The relations derived from (32)

$$b_{10} = c - a_1 + a_2 + a_3, \; b_{20} = c + a_3, \; b_{30} = c + a_2, \quad (39)$$

$$c = \alpha_1 (a_1 - a_2) \quad (40)$$

require only one multiplication. Therewith can be concluded from (27) and (39) that pseudo passivity is seen if the $c_v$ obey the following equations $$c_1 = (c - a_1 + a_2 + a_3)_*^* \; ; \; c_2 = (c + a_3)_*^* \; ; \; c_3 = (c + a_2)_*^* \quad (40a)$$

Since $a_{v=} = a_v$ applies for all $v$, one obtains, while employing the rules 1, 3, 4 and 5 (equation 30b) of Section 4.3, the equations $$c_1 = (c_*^* - a_1 + a_2 + a_3)^*, \; c_2 = (c_*^* + a_3)^*, \; c_3 = (c_*^* + a_2)^* \quad (41)$$

If $c_*^*$ is computed once, two's complement additions must be executed according to Section 4.3.

The calculation of $c_*^*$ must be carried out with great care. From (40) it follows that the difference $a_1 - a_2$ must be exactly determined first. For this reason an additional front bit must be made available for the representation of the relation (20) of this difference, i.e., $k = 1$, while $l = 0$ is still sufficient. Since only $c_-^=$ is required in (41), front and rear chopping can be applied immediately after the product formation $\alpha_1 \cdot (a_1 - a_2)$. In fact, considerable simplifications for the calculation of the product can be made since the rear chopping eliminates the storing of all unneeded bits (compare reference 15), and on account of the front chopping the highest valent (highest order) bits do not have to be calculated at all. In the case that (38) applies, a front chopping does not at all occur.

For a three port series adaptor (compare $N_s$ FIG. 10b, which may be a constituent of adaptor N, and reference 12) with the reflection free port 3, one obtains again $\alpha_3 = 1$ so that (37) and (38) can again be considered as fulfilled. From (34) follows $$b_{10} = a_1 - c, \; b_{20} = -a_1 - a_3 + c, \; b_{30} = -a_1 - a_2, \; c = \alpha_1 a_0, \; a_0 = a_1 + a_2 + a_3.$$

For the quantities $c_v$ occurring in (27) one obtains $$c_1 = [a_1 + (-c^*)_*], \; c_2 = [-a_1 - a_3 + c_*^*]^*, \; c_3 = -(a_1 + a_2)^*.$$

For the representation of $a_o$ one requires two additional front bits and, if (38) is applied, front chopping of c generally becomes necessary. However, it is still correct that the additional front bits do not have to be calculated and that if $c_*^*$ and $(-c^*)_*$ are known, only two's complement-additions are needed. The determination of $(-c^*)_*$ can take place according to Rule 5.

A two port adaptor (compare $N_t$ FIG. 10c which may be a constituent of adaptor N, and references 5 to 7) is described in the simplest manner by the following equations:

whereby $b_{10} = a_2 + c; \; b_{20} = a_1 - c; \; c = \alpha(a_2 - a_1)$ $$\alpha = (R_1 - R_2)/(R_1 + R_2).$$

On account of (5) applies here $-<\alpha<+1$

For the quantities $c_1$ and $c_2$ occurring in (27) one obtains from (42)

$$c_1 = (a_2 + c_*{}^*)^*; \quad c_2 = (a_1 + c_*{}^*)^*.$$

The measures to be taken for this are similar to those for the fulfillment of relation (41).

5.3 Adaptors With Several Multipliers

On account of the above detailed explanation in 5.2, only the expressions for the $c_v$ derived in (27) and some special aspects are to be emphasized in the following. For the following cases it is also assumed that $$a_v = (a_v)_*{}^* \text{ and } c_v = (c_v = (c_v)_*{}^* \text{ for all } v = 1 \text{ to } n.$$

For a parallel adaptor (which may be represented at $N_k$, FIG. 4) with the dependent port $n$ (compare references 5 to 7) one obtains from (32) and (36)

$$b_{v_0} = a_o - a_v, \quad a_o = 2a_n + \sum_{v=1}^{n-1} \alpha_v(a_v - a_n). \tag{43}$$

If $\alpha_n$ is the greatest of the coefficients $\alpha_v$, $$0 < \alpha_v < 1 \text{ for } v = 1, 2, \ldots, n-1 \tag{44}$$

follows from (5), (33) and (36).

One obtains from (43)

$$c = \left[ \left\{ \sum_{v=1}^{n-1} [\alpha_v(a_v - a_n)]_*^* \right\} + (2a_n)^* \right]^* \tag{45a}$$

$$c_v = (c - a_v)^*, \quad v = 1 \text{ to } n, \tag{45b}$$

wherein $c$ is such that $c = c_=^-$. If in addition, corresponding to references 12 and 13, one of the ports is reflection free, e.g., by $\alpha_1 = 1$, (45) can be replaced by $$c_1 = \left[ \left\{ \sum_{v=2}^{n-1} [\alpha_v(a_v - a_n)]^* \right\}_* + a_n \right]^* \tag{46a}$$

$$c_v = (c_1 + a_1 - a_v)^* \text{ for } v = 2 \text{ to } n. \tag{46b}$$

It becomes clear from (45a) and (46a) that after each multiplication, rear chopping should not be applied immediately.

For a series adaptor (which may be represented at $N_k$, FIG. 4) with the dependent port n according to references 5 to 7, one obtains from (34) and (36)

$$b_{v_0} = a_v \alpha_v a_o \text{ for } v = 1 \text{ to } n-1, \tag{47a}$$

and $$b_{n_0} = -a_o - \sum_{v=1}^{n-1} b_{v_0}, \quad a_o = a_1 + a_2 + \ldots + a_n \tag{47b,c}$$

One can thus assume that here, too, the relation (44) holds true so that from (47) follows:

$$c_v = a_v + [\{(a_v a_o)^-_*\}_*]^*, \quad v = 1 \text{ to } n-1$$

$$c_n = \left\{ -(2a_o)^* + a_n + \left[ \sum_{v=1}^{n-1} (a_v a_o)^* \right]_* \right\}^* \tag{48}$$

In this case $a_o$ must be calculated exactly according to (47c). If, in addition, one of the ports, e.g. the port 1, is reflection free and if $\alpha_1 = 1$, then one obtains from (48) for $c_1$ and $c_n$ that same can be replaced by $$c_1 = -(a_o{}^1)^*, \quad c_n = \left\{ -a_o{}^* + a_n + \left[ \sum_{v=2}^{n-1} (\alpha_v a_o)^* \right]_* \right\}^*$$

with $$a_o{}^1 = a_2 + a_3 + \ldots + a_n, \quad a_o = a_o{}^1 + a_1.$$

6. SCALING

Figure 11:
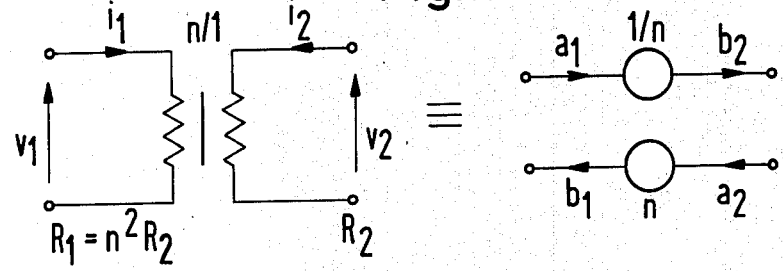
FIG. 11 shows a transformer with the translation ratio n/1 and a corresponding wave flow diagram which is obtained for $R_1/R_2 = n^2$.

The scaling in wave digital filters may take place, for example, by inserting ideal transformers with the translation ratio $n/1$ at various points of a reference filter from which the WD filter is derived. An ideal transformer can be realized by a wave flow diagram which comprises a two-port-adaptor, which means a multiplier. In the present case, this would lead to a non-realizable signal flow diagram. Another possibility illustrated in FIG. 11 consists in the utilization of two multipliers $n$ and $1in$ and is useful (compare reference 20). This realization results from $$v_1 = nv_2, \quad i_2 = -ni_1, \quad a_v = v_v + R_v i_v, \quad b_v = v_v - R_v i_v, \quad v = 1 \text{ and } 2, \text{ if one chooses}$$

$$R_1/R_2 = n^2 \tag{49}$$

instead of $R_1/R_n = n$ as in the case of the realization with only one multiplier. The elimination of of $v_1, v_2, i_1$ and $i_2$ leads to $$b_1 = n a_2; \quad b_2 = a_1/n \tag{50}$$

Figure 12:
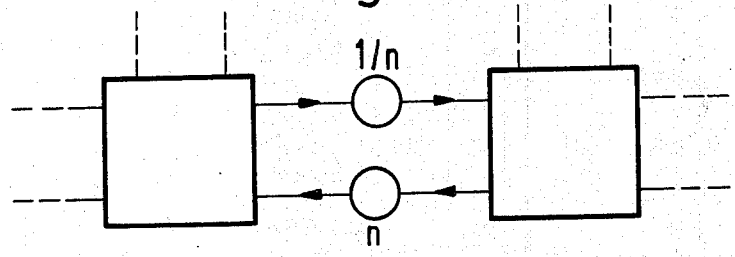
FIG. 12 shows the insertion of the transformer with the translation ratio n/1 between two component blocks.
Figure 17:
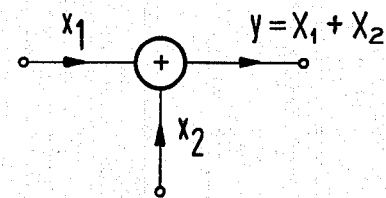
Figure 18:
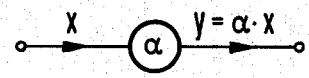

In a wave digital filter structure, two ports according to equation (50) may be inserted, for example, between two successive adaptors as it is indicated schematically in FIG. 12. The existence of two instead of one multiplier is not a great disadvantage since for scaling purposes, n can be equivalent to a positive or a negative double power. The necessary hardware operations are especially simple by means of this.

Even if n is equivalent to a double power, the operations require (the equation (50) requires), the application of a front and a rear chopping. The two port defined by (50) is, on the other hand, pseudo loss free since on account of (49) one obtains $$(a_1{}^2 - b_1{}^2)/R_1 + (a_2{}^2 - b_2{}^2)/R_2 = 0.$$

In order to make (27) applicable it is recommended to write in equation (50) $b_{10}$ and $b_{20}$ instead of $b_1$ and $b_2$.

The quantities $c_1$ and $c_2$ occurring in (27) are determined by $$c_1 = (n a_2)_*{}^*; \quad c_2 = (a_1/n)_*{}^*$$

7. Additional Remarks

1. It was shown that for all adaptors any multiplier $\alpha$ to be provided can be assumed in such a way that $|\alpha| < |$. If $|\alpha| > \frac{1}{2}$, one obtains by means of this $|\beta| \leq \frac{1}{2}$ either for $\beta = 1 - \alpha$ or for $\beta = 1 + \alpha$. Thus, only multipliers are required whose coefficents do not exceed the value $\frac{1}{2}$ in the module. For adaptors which are provided in this manner, the quantities can be determined by the same methods as explained above. 2. It should be pointed out that the condition (18) from which all further conditions were derived, is merely sufficient but not necessary. In fact, one can expect that it is possible to limit the introduction of additional pseudo passivity to certain ports; this means that the correction term $\gamma_v$ would be eliminated in view of the remaining ports (for instance in (27)). This has been tested in practice. 3. For the same reason as stated under 2, it may not be necessary to provide everywhere measures against the granulating oscillations if the degree of the filter and/or the signal word length is sufficiently great, namely as a result of the pseudo passivity adhering to the filter due to the terminal resistances. 4. Likewise for the reason stated in 2, it is often possible to ignore the exception which is pointed out in (30b) in rule 5 of section 4.2. 5. The theory which is explained in detail above is based on the assumption that all port impedances are positive. This assumption is fulfilled as soon as the impedance parameters with respect to the various elements in the reference filter (resistances, inductances, capacitances, unit elements, etc.) are positive; for which we are referring to references 5 to 7, 12 and 13. 6. Only WD two ports were considered above. However, the considerations and rules also apply for WD multiport components, having any desired number of available ports (compare reference 9).

GENERAL DATA

In order to facilitate the understanding of the invention, the conventional switching systems in connection with the associated arithmetic operation are compared in FIGS. 13, 14, 15, 16, 17 and 18. A detailed explanation results from the relations given each time for the switching symbol by means of the reference signs.

Figure 19:
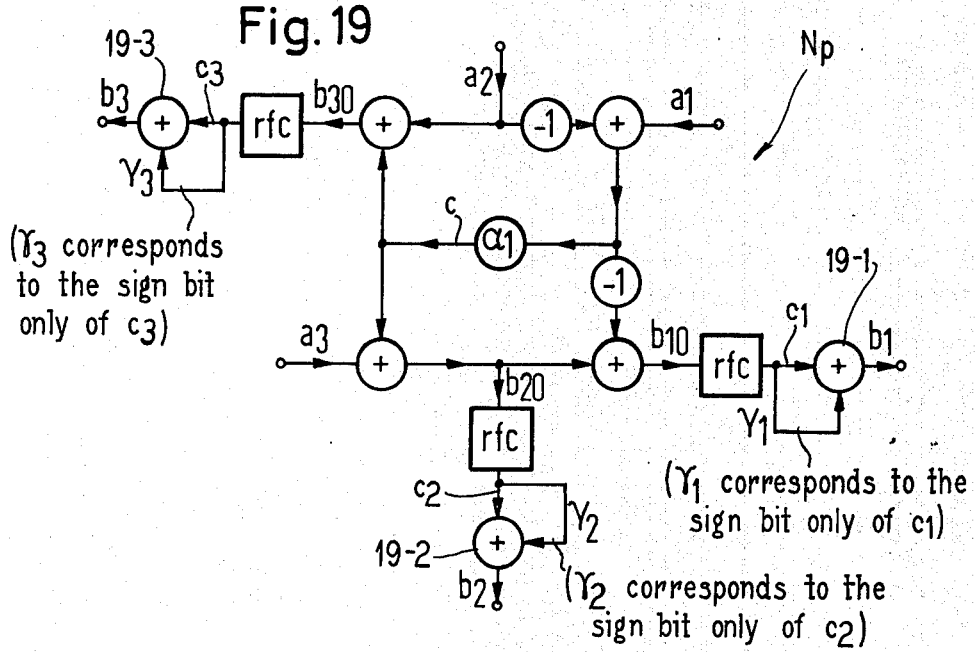
FIG. 19 shows a three port parallel adaptor which is designed according to the invention.
Figure 20:
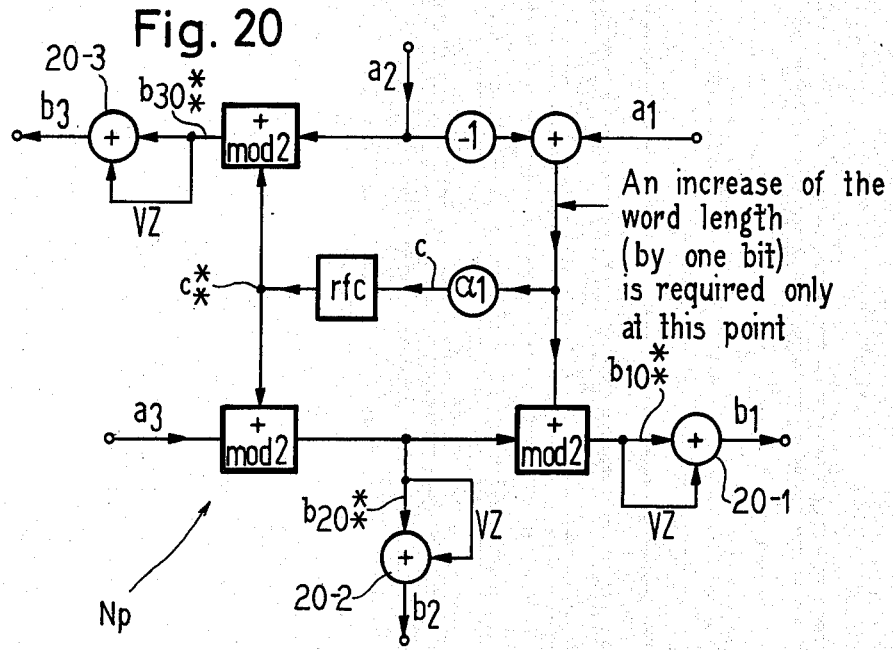
FIG. 20 shows a variation of the circuit according to FIG. 19.

In FIGS. 19 and 20 is shown for a three port adaptor $N_k$ how the corrections of the quantities might be executed in a circuit technical manner. The correction adders required in this case are connected into the respective ports of the parallel adaptor from which waves are emitted. Since the sign bit is guided only to the point of the correction adder having the lowest values, one can take as input for the sign bit the carry input of the individual adder. This correction bit or sign bit, correctively, is designated in FIG. 19 with $\gamma_1$, $\gamma_2$, or $\gamma_3$, respectively depending on which output port is concerned. Otherwise, the adaptor corresponds to the one of the main patent application Ser. No. 402,348 or the initially mentioned improvement patent application Ser. No. 426,090. It may be mentioned furthermore that the output signals of an adaptor are very often supplied to a further adaptor at which input an adder with an unused carry input is located. In such a case, this carry input can then be employed advantageously for the addition of the correction term $x_v$, for economical reasons. On account of the rules given above in § 5.2 and in § 4.3, even a circuit requiring fewer component groups can be derived from FIG. 19. One proceeds thereby from the relations $$b_{10_*}^* = (c_*^* - a_1 + a_2 + a_3)^* \qquad (51a)$$

$$b_{20}^* = (c_-^* + a_3)^* \qquad (51b)$$

$$b_{30_*}^* = (c_*^* + a_2)^* \qquad (51c)$$

$$c_*^* = [\alpha_1(a_1 - a_2)]_*^* \qquad (51d)$$

Figure 21:
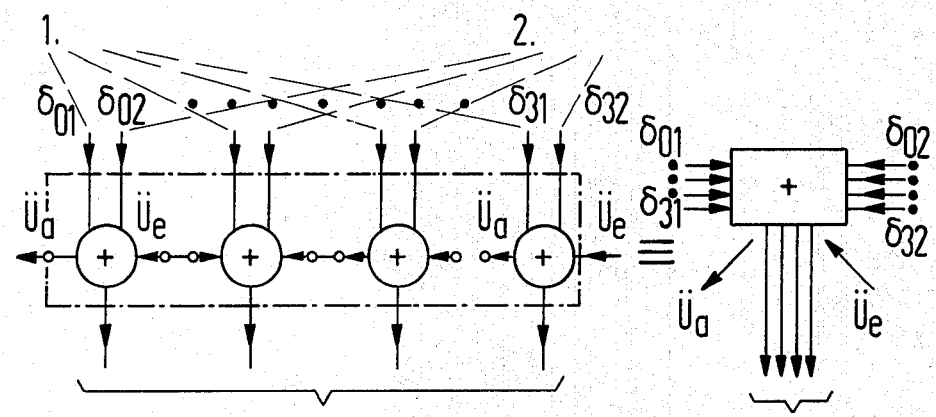
FIG. 21 shows an adder in parallel code design for two four-digit binary numbers.
Figure 22:
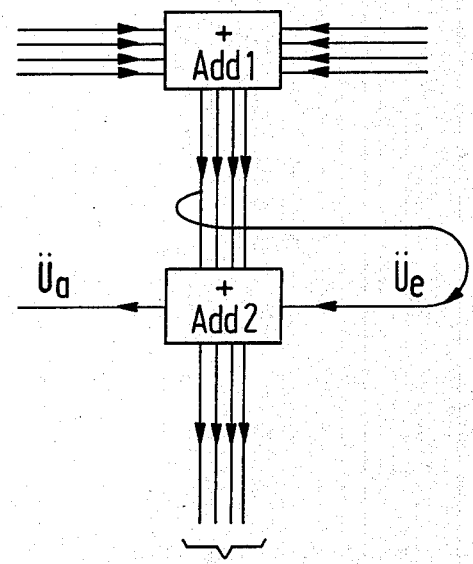
FIG. 22 shows the use of adding stages according to FIG. 21 with provision for the adjustment of the value of the result.

By means of this, one obtains the circuit shown in FIG. 20. It is interesting that only at the adding stage or its output, respectively, serving for the addition of $a_1$ and $a_2$, an increase of the word length by one bit occurs. VZ in this figure means that, as in FIG. 19, only the sign bit is supplied to the respective correction adder. The symbol rfc in FIGS. 19 and 20 signifies a front and rear chopping stage as according to FIG. 15. With regard to the remaining symbols please refer to FIGS. 13 to 18. The symbol $-1$ identifies a multiplier with $-1$ that is, a pure phase inverter which is realizable for instance by a module stage. Basically, adding stages are technically generally known with and without transmitters from an electronic calculating machine. However, in order to facilitate the understanding also in this respect, a parallel adder for two numbers showing each four bit in parallel code is illustrated in FIG. 22 together with the corresponding switching symbol. As shown in FIG. 22, the individual bit $\delta 01$, $\delta 11$, $\delta 21$ and $\delta 31$ of the first number are supplied to each one of the adders, and also the four bits $\delta 02$, $\delta 12$, $\delta_{22}$ and $\delta_{32}$ of the second number are correspondingly fed into the four adding levels. The result can then be received in four digits or in the form of four bits in parallel code from the outputs. Since during the addition of two binary numbers in a single adder, the result or the word length, respectively, can increase by one bit, each individual adder has an output Ua for this carry and also a corresponding input Ue for an additional carry to be fed in. Between each of the four adders, the carry output is connected with the carry input and only in the first and in the last adder the carry input and the carry output are freely available. A switching symbol thus results as it is indicated also in FIG. 21. If the switching procedure is carried out in such a way as illustrated in FIG. 22, namely two adders Add 1 and Add 2 one behind the other, one can achieve a correction of the result coming from Add 2 by means of connecting one of the output lines of the adder 1 with the carry input of the adder 2. This correction is such that upon occurence of the binary digit 1 in the respective output line of the adder 1, the output signal of the adder Add 2 is corrected by the carry input or the carry in the adder 2, respectively, in such a way that its value is smaller than it would be without this correction. Such a circuit is necessary in particular if one of the output quantities $b_v$ of the adaptor is negative, and if it has to be guaranteed that in the case of a disturbance fed into one of the inputs of the adaptor, the adaptor remains pseudo passive.

SPECIFIC EXAMPLES

For the sake of a specific example, FIG. 1 may be taken as showing a wave digital filter whose parameters $R_1, R_2, R_3, R_4, \ldots, R_n$ are those for representing a given analog filter circuit of desired filtering properties and of suitable stability. The analog input signal to the analog filter circuit may be represented by the digital signal quantity $a_1$ at discrete operating times of the wave digital filter, and an output from the analog filter circuit may be represented by the digital signal quantity $b_2$ at discrete operating times (compare Reference 10). The external circuits of FIG. 1 having delays T may be considered to be operative on numbers expressed as fixed-point two's-complement binary fractions as explained in Ref. 15, and as shown in Eqn. (19) herein. The ports $3, 4, \ldots, n$ in FIG. 1 may be taken as corresponding to the ports 3, 4, 5, 6, 7, 8, 9 and 10 in the fifth Figure, part b, of the referenced patent application Ser. No. 426,090 so that FIG. 1 corresponds to the true analog ladder-type filter of part a of such fifth Figure.

The inversion operations at ports 5, 7 and 9 of such fifth Figure to represent inductive analog elements $R_5$, $R_7$ and $R_9$ of the analog filter circuit may be preformed by a parallel complementing circuit (not shown) associated with inputs $a_5$, $a_7$ and $a_9$ in FIG. 1. A serial two's complementer is shown in the eighth Figure of Ref. 15 and the manner of its conversion to parallel form is apparent to those skilled in the art.

Figure 10B:
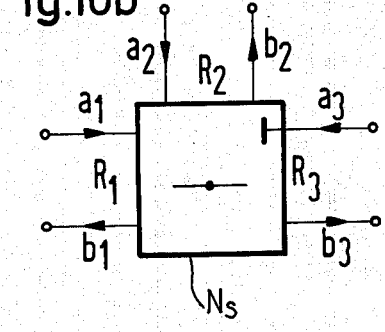
FIG. 10b shows a three port series adaptor whose port 3 is reflection-free (decoupled)

From the aforesaid fifth Figure, part b, it will be seen that for the specific example, the unitary adapter circuit N, FIG. 1, will include a chain or cascade of alternate parallel and series multiport adaptors including parallel adaptors $N_p$, FIG. 10a, associated with ports 3 and 10, and a four-port parallel adaptor $N_k$, FIG. 4, associated with ports 6 and 7, and interposed series adaptors $N_s$, FIG. 10b, having their third ports connected to the decoupled ports of respective parallel three-port adaptors $N_p$ which in turn provide ports 4 and 5, and 8 and 9 of adaptor circuit N, FIG. 1.

For the sake of the present example, each of the adaptors $N_p$, $N_s$ and $N_k$ may as a first alternative, Example 1A, be of a modular construction generally according to FIG. 19, and as a second alternative, Example 1B, be of a modular construction according to FIG. 20.

Figure 10C:
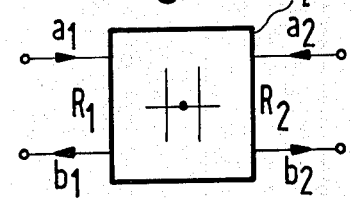
FIG. 10c shows a two port adaptor.

The teachings of sections 5.1 and 6 hereof are alternatively applicable to Examples 1A and 1B so that adaptors $N_t$, FIG. 10c, are interposed in the circuit of this Example 1, or the circuit of FIG. 12 is utilized, so as to introduce scaling into the digital filter section N, FIG. 1, whereby each constituent adaptor $N_p$, $N_s$ and $N_k$ may be based on standardized modular circuits as in FIG. 19 or FIG. 20, with multiplier coefficients as explained in section 7, remark 1.

As a specific case under Example 1A the constituent adaptors $N_k$ of adaptor circuit N of FIG. 1 may be assumed to provide results at internal points corresponding to $b_{10}$, $b_{20}$ and $b_{30}$ in FIG. 19, which results have normal values expressed in the two's complement binary form of Eqn. (20), and conforming with the stability requirements as to $b_{v_0}$ in Section 4. The chopping circuits corresponding to rfc in FIG. 19 then form chopped output quantities conforming to $(b_{v_0})$ as given in Eqn. (27) and of the binary form of Eqn. (19), where m represents the number of bits including the sign bit $\delta_0$. Now if the sign bits corresponding to $\delta_0$ of the respective chopped output quantities are zero, then no further modification is effected at the respective correction adders corresponding to 19-1, 19-2 and 19-3 in FIG. 19. On the other hand, if the sign bits are negative, (corresponding to $\delta_0 = 1$), the correction adders may add to the chopped output quantities respective correction terms corresponding to $\gamma_1$, $\gamma_2$ and $\gamma_3$ in FIG. 19. Such term, in conformity with Eqn. (26) may be equal to $2^{-m+1}$, thus assuring that the negative output quantity $b_v$ at each output (corresponding to output quantities $b_1$, $b_2$, and $b_3$ in FIG. 19) will have an absolute magnitude equal to or less the normal output magnitudes conforming to the term $b_v$ in Eqn. (18) and which correspond to the normal output magnitudes $b_{10}$, $b_{20}$, and $b_{30}$ in FIG. 19. The designations c, and $c_1$, $c_2$, and $c_3$ have been added in FIG. 19 to assist in correlating FIG. 19 with Eqns. (39, 40 and 40a).

As a specific case under Example 1B, the constituent adaptors $N_k$ of adaptor circuit N, FIG. 1, may conform with FIG. 20 and the corresponding discussion in Sections 4.3 and 5. The sign bits (when equal to one to represent a negative number) are added to the carry inputs of correction adders 20-1, 20-2, and 20-3, for example in the manner diagrammed in FIG. 22. The designations $20 - b_{10}$, $20 - b_{20}$ and $20 - b_{30}$ and $c$ and $c_=$ have been added in FIG. 20 to assist in correlation with Eqns. (51a), (51b), (51c), and (51d).

In each of Examples 1A and 1B, the number of bits for representing intermediate results within the constituent adaptors $N_k$ of adaptor N is increased sufficiently so that it can be guaranteed that output signals would conform with the exact values $b_v$ required for meeting the stability criterion. Number modifying means are then employed as taught with reference to port circuit components rfc and 19-1, 19-2, and 19-3 in FIG. 19 and port circuit components mod 2, and 20-1, 20-2 and 20-3 in FIG. 20 such that the absolute magnitudes of the output signal quantities $b_v$ will satisfy Eqn. (18), while utilizing a reduced fixed word length for such output signal quantities. The number modifying means for each port in FIGS. 19 and 20 may be termed a signal quantity modifying port circuit to emphasize that such circuits operate on the port circuit signal quantities, and are not concerned per se with truncation or rounding which may be effected as a normal part of a multiplication operation.

We claim as our invention:

1. A digital computer filter for electrical signals comprising at least one circuit section without delay elements in the form of a multiport circuit, with a positive port admittance at each port and with an input and output signal quantity at each port at the respective operating times, characterized in that signal quantity modifying port circuits for rounding or chopping of the numbers representing signal quantities are provided in the multiport circuit, and are designed in such a way that the pseudo power $p(t_m)$ received by the multiport circuit at every time $t_m$ and which satisfies the relation $$p(t_m) = \sum_{v=1}^{n} G_v[a_v^2(t_m) - b_v^2(t_m)]$$

where
$v$ = number of ports $(1, 2, \ldots n)$
$a_v(t_m)$ = input signal quantity at the time $t_m$ in the $v$ th port
$b_v(t_m)$ = output signal quantity at the time $t_m$ in the $v$ th port
$G_v$ = port admittance of the $v$ th port
is equivalent or only slightly greater than that value of the pseudo power function which results if, by omitting the rounding or chopping circuits, the arithmetic operations are executed with precise accuracy.

2. A digital computer filter according to claim 1, characterized in that the signal quantity modifying port circuits are designed in such a way that at least at some ports the value of $b_v(t_m)$ does not exceed the value which would occur at these ports in the case of an exact execution of the arithmetic operations.

3. A digital filter for electrical signals comprising at least one circuit section without delay elements in the form of a multiport circuit, each port of said multiport circuit being associated with a positive port admittance and with an input and output signal quantity at the respective operating times, characterized in that the multiport circuit comprises number modifying means operating on selected digit positions of numbers for representing respective signal quantities in such a way that the pseudo power $p(t_m)$ received by the multiport circuit at every time $t_m$ and which satisfies the relation $$p(t_m) = \sum_{v=1}^{n} G_v[a_v^2(t_m) - b_v^2(t_m)].$$

where
 $v$ = number of ports (1, 2, ... $n$)
 $a_v(t_m)$ = input signal quantity at the time $t_m$ in the $v$ th port
 $b_v(t_m)$ = output signal quantity at the time $t_m$ in the $v$ th port
 $G_v$ = port admittance of the $v$ th port
is equivalent or only slightly greater than that value of the pseudo power function which results if, by omitting said number modifying means, the arithmetic operations are executed with precise accuracy.

4. A digital filter according to claim 3, characterized in that the number modifying means serves to chop off extreme digit positions of numbers for representing signal quantities at at least certain of the ports such that the output signal quantity $b_v(t_m)$ for each of the certain ports does not exceed the value which would occur at such certain ports in the case of an exact execution of the arithmetic operations.

5. A digital filter comprising an adaptor circuit having a series of ports with respective positive port admittances and having adders and multipliers connected with the respective ports for arithmetically operating on respective port input signal quantities and for supplying respective output signal quantities at respective discrete operating times, and a series of reactance-representing port elements with respective time delays incorporated therein coupled with respective ports of said adaptor circuit and corresponding with respective analog reactances of an analog filter circuit, and means comprising the circuit arrangement of the adders and multipliers and the values of multiplier coefficients for determining values for the port admittances substantially in conformity with the parameter values of the respective analog reactances being represented by the port elements coupled with the respective ports, wherein the improvement comprises number modifying means for selectively digitally modifying the numerical results of the arithmetic operations being supplied to selected ports in said adaptor circuit for achieving a predetermined stability criterion with a substantially reduced word length in comparison to a normal word length required for achieving the predetermined stability criterion while approximating said analog filter circuit substantially as closely as possible.

6. A digital filter in accordance with claim 5 with said adaptor circuit including as a constituent thereof a three port adaptor having means including only one multiplier for determining values for the port admittances thereof so as to substantially match the admittances of respective ports connected therewith and for supplying respective output signal quantities to the respective ports thereof, and the number modifying means comprising a device for reducing the word length and changing the value of the output signal quantity supplied to at least one of the ports thereof from a normal value relatively closely approximating that dictated by the parameters of the analog filter circuit to a modified value somewhat less than any approximation of the ideal value.

7. A digital filter according to claim 5 with the adaptor circuit being free of time delay elements and having an input port for receiving input signal quantities representing an input signal to the analog filter at respective discrete operating times, having an output port, and having interior circuitry corresponding to an analog filter circuit of an order greater than three, and including a plurality of constituent multiport circuits each including said number modifying means for reducing word lengths at the outputs of the respective ports thereof.

* * * * *